United States Patent
Suganuma et al.

(10) Patent No.: US 9,217,192 B2
(45) Date of Patent: Dec. 22, 2015

(54) SEMICONDUCTOR DEVICE AND BONDING MATERIAL FOR SEMICONDUCTOR DEVICE

(75) Inventors: Katsuaki Suganuma, Suita (JP); Seongjun Kim, Suita (JP)

(73) Assignee: OSAKA UNIVERSITY, Suita-Shi, Osaka (JP)

( * ) Notice: Subject to any disclaimer, the term of this patent is extended or adjusted under 35 U.S.C. 154(b) by 0 days.

(21) Appl. No.: 13/581,941

(22) PCT Filed: Feb. 24, 2011

(86) PCT No.: PCT/JP2011/054133
§ 371 (c)(1),
(2), (4) Date: Aug. 30, 2012

(87) PCT Pub. No.: WO2011/108436
PCT Pub. Date: Sep. 9, 2011

(65) Prior Publication Data
US 2012/0319280 A1    Dec. 20, 2012

(30) Foreign Application Priority Data
Mar. 1, 2010    (JP) .................................. 2010-043666

(51) Int. Cl.
*H01L 23/48*    (2006.01)
*C22C 18/00*    (2006.01)
(Continued)

(52) U.S. Cl.
CPC ............... *C22C 18/00* (2013.01); *B23K 35/282* (2013.01); *H01L 24/29* (2013.01); *H01L 24/32* (2013.01);
(Continued)

(58) Field of Classification Search
CPC .................... H01L 24/32; H01L 24/29; H01L 2924/00013; H01L 2924/29111; C22C 18/00; B23K 35/282
USPC .......................................................... 257/751
See application file for complete search history.

(56) References Cited

U.S. PATENT DOCUMENTS 4,647,308 A    3/1987    Beal
5,807,626 A  *  9/1998    Naba .............................. 428/210
(Continued)

FOREIGN PATENT DOCUMENTS

JP    54-32063    *  3/1979
JP    S-063395       4/1986
(Continued)

OTHER PUBLICATIONS

International Search Report PCT/JP2011/054133 and English Translation issued May 24, 2011.
(Continued)

*Primary Examiner* — Ahmed Sefer
(74) *Attorney, Agent, or Firm* — Roberts Mlotkowski Safran & Cole P.C.

(57) ABSTRACT

In a semiconductor device 100 according to the present invention in which a semiconductor member 120 is stacked on a substrate 110, the semiconductor member 120 and the substrate 110 are bonded together by means of a semiconductor device bonding material 130 of which main component is zinc. Further, a coating layer to prevent diffusion of the semiconductor device bonding material 130 is provided on at least one of the surface of the substrate 110 and the surface of the semiconductor member 120. In addition, the coating layer 140 is configured such that a barrier layer 141 composed of nitride, carbide, or carbonitride and a protective layer 142 composed of a noble metal are stacked. Further, the nitride, the carbide, or the carbonitride composing the barrier layer 141 is selected so as to have free energy smaller than that of a material composing an insulating layer 111 provided in the substrate 110.

8 Claims, 12 Drawing Sheets

(51) Int. Cl.
*B23K 35/28* (2006.01)
*H01L 23/00* (2006.01)

(52) U.S. Cl.
CPC ......... *B23K 2201/40* (2013.01); *H01L 2224/29* (2013.01); *H01L 2224/29111* (2013.01); *H01L 2224/29298* (2013.01); *H01L 2224/325* (2013.01); *H01L 2224/32507* (2013.01); *H01L 2924/00013* (2013.01); *H01L 2924/0102* (2013.01); *H01L 2924/0103* (2013.01); *H01L 2924/01004* (2013.01); *H01L 2924/01005* (2013.01); *H01L 2924/01005* (2013.01); *H01L 2924/01006* (2013.01); *H01L 2924/01023* (2013.01); *H01L 2924/01024* (2013.01); *H01L 2924/01025* (2013.01); *H01L 2924/01029* (2013.01); *H01L 2924/0132* (2013.01); *H01L 2924/01033* (2013.01); *H01L 2924/01041* (2013.01); *H01L 2924/01046* (2013.01); *H01L 2924/01047* (2013.01); *H01L 2924/01079* (2013.01); *H01L 2924/01082* (2013.01); *H01L 2924/01327* (2013.01); *H01L 2924/04941* (2013.01); *H01L 2924/1033* (2013.01); *H01L 2924/10272* (2013.01); *H01L 2924/15787* (2013.01)

(56) References Cited

U.S. PATENT DOCUMENTS

| | | | | |
|---|---|---|---|---|
| 7,578,966 | B2* | 8/2009 | Suh | 420/555 |
| 2001/0029095 | A1* | 10/2001 | Tadauchi et al. | 438/612 |
| 2006/0067853 | A1* | 3/2006 | Takahashi et al. | 420/557 |
| 2006/0104854 | A1* | 5/2006 | Kobayashi et al. | 420/524 |
| 2010/0186999 | A1 | 7/2010 | Kuramoto et al. | |
| 2010/0193801 | A1* | 8/2010 | Yamada et al. | 257/77 |
| 2012/0000965 | A1* | 1/2012 | Ikeda et al. | 228/249 |

FOREIGN PATENT DOCUMENTS

| | | |
|---|---|---|
| JP | 61-119049 A | 6/1986 |
| JP | 6-79494 A | 3/1994 |
| JP | 06-163737 A | 6/1994 |
| JP | 2006-255762 A | 9/2006 |
| JP | 2006-320913 | 11/2006 |
| JP | 2007-326137 | 12/2007 |
| JP | 2009-129983 A | 6/2009 |

OTHER PUBLICATIONS

"Thermal Properties and Phase Stability of Zn-Sn and Zn-In Alloys as High Temperature Lead Free Solder" Jae-Ean Lee et al. Materials Transactions, vol. 48, No. 3 (2007) pp. 584 to 593.

* cited by examiner

SEMICONDUCTOR DEVICE AND BONDING MATERIAL FOR SEMICONDUCTOR DEVICE

CROSS-REFERENCE TO RELATED APPLICATIONS

The present Application is a U.S. National Phase of PCT/JP2011/054133, filed on Feb. 24, 2011 ("PCT Application"), which claims priority from Japanese Application No. 2010-043666, filed on Mar. 1, 2010. The PCT and Japanese Applications are hereby incorporated by reference in their entirety into the present Application. The PCT application, incorporated by reference herein, includes any amendments entered in the PCT application.

TECHNICAL FIELD

The present invention relates to semiconductor devices in which a semiconductor member is stacked on a substrate and a semiconductor device bonding materials for bonding a semiconductor member and a substrate together.

BACKGROUND ART

In general, dies (semiconductor elements) and substrates are bonded together with bonding materials in semiconductor packaging processes. For example, Patent Literature 1 discloses a semiconductor device in which a semiconductor element is die attached to a die pad.

CITATION LIST

Patent Literature

[PTL 1] Japanese Patent Application Laid-Open Publication No. 6-163737

SUMMARY OF INVENTION

Technical Problem

Incidentally, in the semiconductor device of PLT 1, lead having a low melting point is used as a main component of a bonding material. For example, power modules used in hybrid automobiles generate heat in their devices themselves by large current. Further, the modules are located near the engines. Thus, the modules undergo severe temperature environment. Therefore, the bonding material is inferior in thermal stability as and cannot be used as a bonding material for die attachment of next-generation power semiconductors (SiC semiconductor chips) that are assumed to be used under high temperatures of 200° C. or higher.

The present invention has its object of providing a compound semiconductor device, such as of a GaN semiconductor, a SiC semiconductor, etc. developed as a next-generation power semiconductor and a semiconductor device bonding material excellent in thermal stability as a bonding material for die attaching of a semiconductor device.

Solution to Problem

To solve the above problems, a semiconductor device according to the present invention is characterized by including a substrate and a semiconductor member stacked on the substrate, wherein the semiconductor member and the substrate are bonded together by means of a semiconductor device bonding material of which main component is zinc.

As described in BACKGROUND ART, in order to bond a semiconductor member to a substrate, the conventional semiconductor devices use the semiconductor device bonding materials of which main component is lead. However, the semiconductor device bonding materials have low melting points. Therefore, the bonding materials are inferior in thermal stability as and cannot be used as a bonding material for die attachment of the GaN semiconductors and the SiC semiconductors developed as the next-generation power semiconductors that are assumed to be used under high temperatures of 200° C. or higher. By contrast, the semiconductor device according to the present invention uses the semiconductor device bonding material of which main component is zinc having a melting point of 420° C. This can obtain a next-generation power semiconductor device excellent in thermal fatigue resistance that can withstand temperature cycles up to 300° C.

According to one preferred aspect of the semiconductor device of the present invention, a coating layer to prevent diffusion of the semiconductor device bonding material is provided on at least one of the surface of the substrate and the surface of the semiconductor member. Accordingly, a reaction between the substrate and the semiconductor device bonding material and/or a reaction between the semiconductor member and the semiconductor device bonding material can be inhibited to prevent formation of a reaction layer with less strength. As a result, the bonding strength between the substrate and the semiconductor device bonding material and/or the bonding strength between the semiconductor member and the semiconductor device bonding material can be maintained, thereby obtaining a more reliable semiconductor device.

According to one preferred aspect of the semiconductor device of the present invention, the coating layer is configured such that a barrier layer composed of nitride, carbide, or carbonitirde and a protective layer composed of a noble metal are stacked. With the barrier layer provided, the semiconductor device bonding material can be prevented from diffusing into the substrate. Further, noble metals (especially, Au) can improve the wettability of the semiconductor device bonding material with respect to the coating layer. This can achieve favorable bonding between the semiconductor device bonding material and the substrate.

According to one preferred aspect of the semiconductor device of the present invention, the nitride, the carbide, or the carbonitride composing the barrier layer is selected so as to have free energy smaller than that of a material composing an insulating layer provided in the substrate. Accordingly, activation of the barrier layer can be suppressed to prevent the material composing the substrate or the semiconductor member from moving toward the semiconductor device bonding material. This can inhibit the reaction between the substrate and the semiconductor device bonding material and the reaction between the semiconductor member and the semiconductor device bonding material, thereby preventing formation of a reaction layer with less strength. As a result, a highly reliable semiconductor device can be obtained.

According to one preferred aspect of the semiconductor device of the present invention, a material composing the barrier layer is TiN, a material composing the protective layer is Au, Ag, Cu, Ni, or Pd, and a material composing the insulating layer included in the substrate is $Si_3N_4$, $Al_2O_3$, or AlN. For example, TiN as a material composing the barrier layer has free energy smaller than $Si_3N_4$ as a material composing the insulating layer included in the substrate. Further, the bonding force between Ti and N is larger than that between Ti and Zn and that between N and Zn. Accordingly, the reaction between the substrate and the semiconductor device bonding material can be inhibited, thereby preventing formation of a reaction layer with less strength. This can result in a highly reliable semiconductor device similarly to the above description. In addition, since Au, Ag, Cu, Ni, and Pd as materials composing the protective layer can improve the wettability of the semiconductor device bonding material with respect to the coating layer, provision of an Au layer, an Ag layer, a Cu layer, an Ni layer or a Pd layer at the bonding interface to the semiconductor device bonding material can prevent void formation at the bonding interface, thereby obtaining a favorable bonding interface.

According to one preferred aspect of the semiconductor device of the present invention, the zinc has a purity of 90 wt % or higher. Zinc is a metal excellent in flexibility and conductivity. Accordingly, when 90 wt % or higher of zinc is contained in the semiconductor device bonding material, breakdown, which is caused due to a shock by bending, folding, or the like a semiconductor device, can be prevented. It is preferable that the zinc has a purity of 99.9999 wt % or higher. The use of highly pure zinc can increase the elongation of the semiconductor device bonding material.

According to one preferred aspect of the semiconductor device of the present invention, the bather layer has a thickness in the range from 100 nm to 2000 nm, and the protective layer has a thickness in the range from 20 nm to 500 nm. With the thicknesses of the layers in the respective ranges, the barrier layer can sufficiently prevent diffusion of the semiconductor device bonding material, and the protective layer can reliably prevent oxidation and contamination of the semiconductor device bonding material.

According to one preferred aspect of the semiconductor device of the present invention, the semiconductor device bonding material contains an additive element.

With the additive element contained, the characteristics of the semiconductor device bonding material can be improved. It is preferable that the additive element includes at least one element selected from the group consisting of Ca, Mn, Ti, Cr, Ni, V, and Nb. With such an additive element added, the semiconductor device bonding material can be increased in ductility and can be prevented from being oxidized.

In order to solve the above problems, in a semiconductor device in which a semiconductor member is stacked on a substrate, a semiconductor device bonding material according to the present invention is characterized by bonding the semiconductor member and the substrate together and including zinc as a main component.

According to the semiconductor device bonding material of the present invention, the same operation and effects can be obtained as those obtained by the semiconductor device according to the present invention as described above. Since the semiconductor device bonding material according to the present invention is a semiconductor device bonding material of which main component is zinc having a melting point of 420° C., the use of the semiconductor device bonding material can obtain a next-generation power semiconductor device excellent in thermal fatigue resistance that can withstand temperature cycles up to 300° C.

BRIEF DESCRIPTION OF DRAWINGS

FIG. 6 explains the configuration of a shear test sample and results of a shear test, wherein

DESCRIPTION OF EMBODIMENTS

Embodiments of a semiconductor device and a semiconductor device bonding material according to the present invention will be described with reference to FIGS. 1 and 2. Then, examples of the present invention will be described with reference to FIGS. 3-14. It is noted that the present invention is not limited to the following embodiments.

Figure 1:
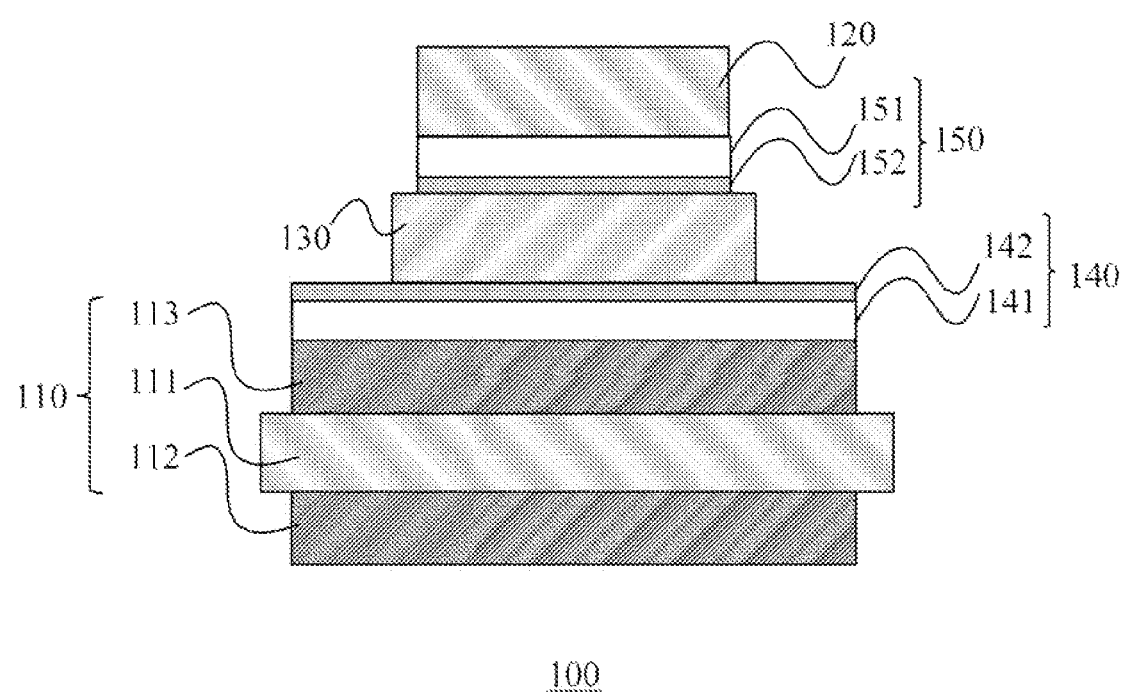
FIG. 1 is a schematic illustration showing a semiconductor device according to one embodiment of the present invention.

FIG. 1 is a schematic illustration showing a semiconductor device 100 according to one embodiment of the present invention. The semiconductor device 100 has a configuration in which a semiconductor member 120 is stacked on a substrate 110. The substrate 110 and the semiconductor member 120 are bonded together by means of a semiconductor device bonding material 130, of which main component is zinc. The semiconductor device bonding material 130 is used as a die attaching material (material for die bonding of semiconductor) in semiconductor manufacturing processes. It is a bond in the form of a thin film layer, paste, a film, or the like to bond a semiconductor member (e.g., a die chip) and a substrate together. Since the material of which main component is zinc has a melting point of about 420° C., it may not be melted even at high temperatures around 300° C., thereby exhibiting a function as a die attaching material (material for die bonding of semiconductor).

The substrate 110 includes an insulating layer 111 and Cu layers (a first Cu layer 112 and a second Cu layer 113) bonded on the opposite surfaces of the insulating layer 111. A first coating layer 140 to prevent diffusion of the semiconductor device bonding material 130 is provided on a surface of the substrate 110. The first coating layer 140 is configured such that a first barrier layer 141 composed of nitride, carbide, or carbonitride and a first protective layer 142 composed of a noble metal are stacked.

A second coating layer 150 to prevent diffusion of the semiconductor device bonding material 130 is provided on a surface of the semiconductor member 120. The second coating layer 150 is configured such that a second barrier layer 151 composed of nitride, carbide, or carbonitride and a second protective layer 152 composed of a noble metal are stacked.

The material composing the semiconductor member 120 may be SiC, for example, to allow the semiconductor device 100 to function as an SiC semiconductor device. Alternatively, the material composing the semiconductor member 120 may be GaN to allow the semiconductor device 100 to function as a GaN semiconductor device. In addition, the material composing the insulating layer 111 may be, for example, $Si_3N_4$, but is not limited to $Si_3N_4$ as long as the insulating layer 111 can function as an insulator. For example, the insulating layer 111 may be composed of $Al_2O_3$ or MN. Or, the insulating layer 111 may be composed of another ceramics.

It is preferable that each thickness of the first protective layer 142 and the second protective layer 152 is in its extent ranging approximately from 20 nm to 500 nm. Each of the first protective layer 142 and the second protective layer 152 is composed of a noble metal. As the noble metal, Au, Ag, Cu, Ni, or Pd can be employed, for example. The noble metal of Au, Ag, Cu, Ni, and Pd can ensure the wettability of the semiconductor device bonding material 130 to prevent contamination of the semiconductor device bonding material. Provision of an Au layer, an Ag layer, a Cu layer, an Ni layer, or a Pd layer at the bonding interface to the semiconductor device bonding material 130 can prevent void formation at the bonding interface, thereby obtaining a favorable bonding interface.

It is preferable that each thickness of the first barrier layer 141 and the second barrier layer 151 is in its extent ranging approximately from 100 nm to 2000 nm With each thickness of the barrier layers 141, 151 falling in this range, the barrier layers 141, 151 can sufficiently prevent diffusion of the semiconductor device bonding material 130. Any of the nitride, carbide, and carbonitride composing the first barrier layer 141 and the second barrier layer 151 is selected so as to have free energy smaller than that of the material composing the insulating layer 111. This can suppress activation of each barrier layer 141, 151 to prevent the material composing the substrate 110 or the semiconductor member 120 from moving toward the semiconductor device bonding material 130. Thus, a reaction between the substrate and the semiconductor device bonding material and a reaction between the semiconductor member and the semiconductor device bonding material can be inhibited, thereby preventing formation of a reaction layer with less strength. As a result, a highly reliable semiconductor device can be obtained.

Figure 2:
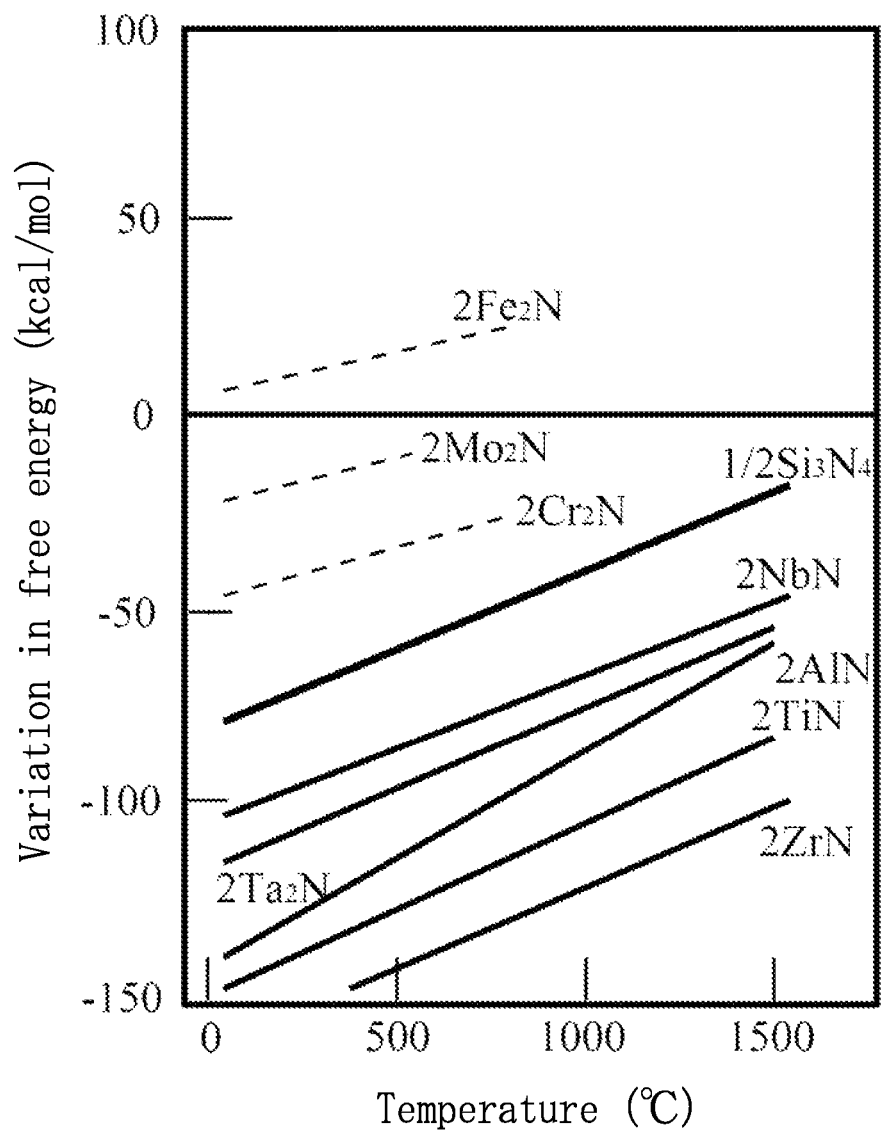
FIG. 2 is a graph representation showing each variation in free energy of various nitrides.

FIG. 2 is a graph representation showing each variation in free energy of various nitrides. The axis of ordinate indicates variation (kcal/mol) in free energy in a reaction (Me+$N_2$→Me-nitride). The axis of abscissa indicates temperature (° C.). With reference to FIG. 2, NbN, TiN, $Ta_2N$, and ZrN are smaller in variation in free energy in the reaction than $Si_3N_4$. When the material composing the insulating layer is $Si_3N_4$, for example, TiN can be selected as a material composing the first barrier layer 141 and the second barrier layer 151. The free energy of TiN is smaller than that of $Si_3N_4$. Besides, NbN, TiN, $Ta_2N$, and ZrN can be used as the material composing the first barrier layer 141 and the second barrier layer 151. It is noted that where the material composing the first barrier layer 141 and the second barrier layer 151 is carbide, TiC, TaC, ZrC, NbC, and the like may be used, for example. Further, the first barrier layer 141 and the second bather layer 151 composed of TiC or NbC may be formed in such a manner that after the first barrier layer 141 and the second barrier layer 151 composed of Ti or Nb are formed in advance, SiC composing the semiconductor member 120 is allowed to react with Ti or Nb to change the material composing the first barrier layer 141 and the second barrier layer 151 to TiC or NbC. This reaction may be caused in a solid phase. While, solving a metal barrier (e.g., Ti) into the liquid can readily cause the reaction with SiC. Alternatively, the material composing the first barrier layer 141 and the second barrier layer 151 may be carbonitride, such as TiCN. It is noted that the first barrier layer 141 and the second barrier layer 151 may be composed of materials different from each other.

The embodiments of the semiconductor device 100 and the semiconductor device bonding material 130 according to the present invention have been described with reference to FIGS. 1 and 2. It is noted that as long as the substrate 110 and the semiconductor member 120 are bonded together by means of the semiconductor device bonding material 130 of which main component is zinc in the semiconductor device 100, the substrate 110 is not limited to having the first coating layer 140 on the surface thereof. Likewise, the semiconductor member 120 is not limited to having the second coating layer 150 on the surface thereof. The first coating layer 140 may not be provided on the surface of the substrate 110. The second coating layer 150 may not be provided on the surface of the semiconductor member 120.

Moreover, referring to the first coating layer 140 and the second coating layer 150, each of the first protective layer 142 and the second protective layer 152 is not limited to being a single layer of a noble metal as long as a noble metal layer is provided on the bonding interfaces to the semiconductor device bonding material 130. At least one of the first protective layer 142 and the second protective layer 152 can have at least one metal layer in addition to a single layer of a noble metal. Further, each of the first protective layer 142 and the second protective layer 152 can include a plurality of noble metal layers, such as a noble metal layer including, for example, an Ni layer and an Au layer. Furthermore, a trace amount of an additive can be added to the semiconductor device bonding material 130 when the main component of the material 130 is zinc. The purity of zinc as the main component of the semiconductor device bonding material 130 is 90 wt % or higher, and preferably high purity (99.99 wt % or higher).

In the semiconductor device and the semiconductor device bonding material according to the present invention, the semiconductor device bonding material of which main component is zinc having a melting point of 420° C. is used. Thus, a next-generation power semiconductor device excellent in thermal fatigue resistance that can withstand temperature cycles up to 300° C. can be obtained. Further, the coating layer to prevent diffusion of the semiconductor device bonding material is provided on the surface of the substrate. This can inhibit the reaction between the substrate and the semiconductor device bonding material, thereby preventing formation of a reaction layer with less strength. As a result, the bonding strength between the substrate and the semiconductor device bonding material can be maintained, thereby obtaining a highly reliable semiconductor device.

In particular, TiN as a material composing the barrier layers, Au, Ag, Cu, Ni, or Pd as a material composing the protective layers, and $Si_3N_4$, $Al_2O_3$, or AlN as a material composing the insulating layer included in the substrate can compose a favorable semiconductor device according to the present invention. For example, TiN as a material composing the barrier layers has free energy smaller than $Si_3N_4$ as a material composing the insulating layer included in the substrate. Further, the bonding force between Ti and N is stronger than that between Ti and Zn and that between N and Zn. Accordingly, the reaction between the substrate and the semiconductor device bonding material can be inhibited to prevent formation of a reaction layer with less strength. As a result, likewise the above description, a highly reliable semiconductor device can be obtained. In addition, Au, Ag, Cu, Ni, and Pd as materials composing the protective layers can improve the wettability of the semiconductor device bonding material with respect to the coating layers. Accordingly, when an Au layer, an Ag layer, a Cu layer, an Ni layer, or a Pd layer is provided on the bonding interfaces to the semiconductor device bonding material, void formation at the bonding interfaces can be prevented to obtain an excellent bonding interfaces.

As described above, a trace amount of an additive element may be added to zinc serving as the main component in the semiconductor device bonding material 130. Preferably, the additive element includes at least one element selected from the group consisting of, for example, Ca (calcium), Mn (manganese), Ti (titanium), Cr (chromium), Ni (nickel), V (vanadium), and Nb (niobium). It is noted that Ca is an alkaline-earth metal, and Mn, Ti, Cr, Ni, V, and Nb are transition metals. In particular, Ni, V, and Nb are also called high melting point metals. Addition of such an additive element can improve the ductility of the semiconductor device bonding material 130 and can reduce oxidation of the semiconductor device bonding material 130. It is considered that when an element that tends to be oxidized more easily than zinc is used as an additive element, an oxide film serving as a protective film for zinc might be formed on the surface of the semiconductor device bonding material 130. Further, the use of highly pure zinc in the semiconductor device bonding material 130 can improve the ductility.

When exposed copper is exposed under a temperature environment over 200° C., oxidation may significantly proceed to generate an oxide at the respective interfaces between the copper and SiC and between the copper and ceramics to reduce the strength. By contrast, when the Cu layer 113 on the surface of the insulating layer 111 is covered with TiN as a material composing the first barrier layer 141, oxidation of the copper hardly proceeds even under high temperatures around 300° C. Thus, the use of TiN as a material composing the first barrier layer 141 can suppress reduction in strength at the interfaces of SiC/TiN/copper/ceramics.

EXAMPLES

Examples of the present invention will be described below with reference to FIGS. 3-14.
[Samples for Thermal Shock Test]
For a thermal shock test, a sample 1 for a thermal shock test, a sample 2 for a thermal shock test, and a comparative sample for a thermal shock test were prepared.

Referring to the sample 1 for a thermal shock test, pure zinc (a purity of 99.99 wt %, 4 mm long, 4 mm wide, and 0.2 mm thick) was used as the semiconductor device bonding material 130. As the insulating layer 111, an $Si_3N_4$ layer (15 mm long, 15 mm wide, and 0.5 thick) was used. An Au layer (13 mm long, 13 mm wide, and 200 nm thick) as the first protective layer 142 and a TiN layer (13 mm long, 13 mm wide, and 800 nm thick) as the first barrier layer 141 were formed on one surface of the substrate 100 (the second Cu layer 113 (13 mm long, 13 mm wide, and 0.5 mm thick)). The Au layer was stacked on the side of the semiconductor device bonding material 130, and the TiN layer was stacked on the side of the second Cu layer 113. An Au layer (3 mm long, 3 mm wide, and 200 nm thick) as the second protective layer 152 and a TiN layer (3 mm long, 3 mm wide, and 800 nm thick) as the second barrier layer 151 were formed on one surface of the semiconductor member 120 (3 mm long, 3 mm wide, and 1 mm thick). The Au layer is stacked on the side of the semiconductor device bonding material 130, and the TiN layer is stacked on the side of the semiconductor member 120.

The sample 2 for a thermal shock test includes, of the layers of the sample 1 for a thermal shock test, the layers other than the first coating layer 140. The comparative sample for a thermal shock test has the same configuration as the sample 1 for a thermal shock test except that Pb-5Sn having a melting point of 315° C. was used as the semiconductor device bonding material.

Each of the thermal shock test sample 1 and the thermal shock test comparative sample was prepared by polishing the surface of the first Cu layer and vapor depositing the first coating layer. Each semiconductor device bonding material of the thermal shock test sample 1, the thermal shock test sample 2, and the thermal shock test comparative sample was melted by an infrared furnace (under an Ar atmosphere at a temperature of 450° C. for 60 seconds (melting point of 420° C. or higher for 100 seconds)).
[Thermal Shock Test]
A temperature cycle (0-500 times) between −50° C. and 300° C. in the air was performed on each of the thermal shock test sample 1, the thermal shock test sample 2, and the thermal shock test comparative sample. In each cycle, the samples were held for 30 minutes.

Figure 3:
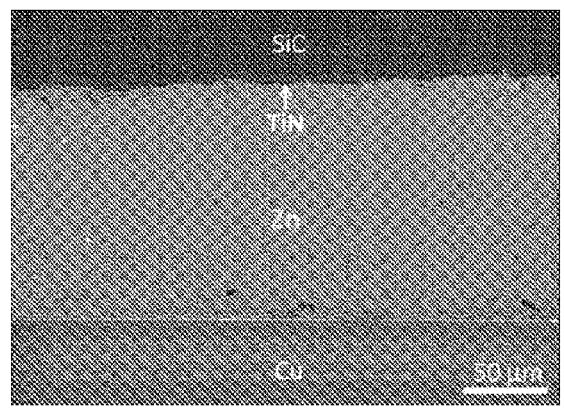
FIG. 3 is a photo showing a cross section of a sample 1 for a thermal shock test after a thermal shock test.

FIG. 3 is a photo showing a cross section of the thermal shock test sample 1 after the thermal shock test. The thermal shock test sample 1 after the thermal shock test includes an SiC layer (the semiconductor member 120), a TiN layer (the second barrier layer 151), a Zn layer (the semiconductor device bonding material 130), and a Cu layer (the second Cu layer 113). Both the bonding interface between the semiconductor member 120 and the semiconductor device bonding material 130 and the bonding interface between the substrate 110 and the semiconductor device bonding material 130 were thoroughly wet, and no void could be found. An AuZn compound was recognized inside the Zn layer (the semiconductor device bonding material 130), of which amount is too small to be determined ((18-22 at %) Au to (78-82 at %) Zn).

Outside observation and low-magnification observation of the thermal shock test sample 1 after the thermal shock test could recognize no significant bonding failure (crack, interface separation, etc.). Thus, favorable bonding was achieved between the semiconductor member 120 and the semiconductor device bonding material 130 and between the substrate 110 and the semiconductor device bonding material 130. At each of the interface as the bonding interface between the semiconductor member 120 and the semiconductor device bonding material 130 and the interface as the bonding interface between the substrate 110 and the semiconductor device bonding material 130, only the TiN layer (the second barrier layer 151) was formed.

Figure 4:
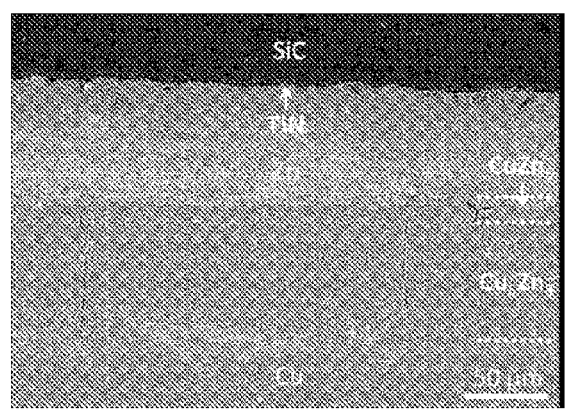
FIG. 4 is a photo showing a cross section of a sample 2 for a thermal shock test after the thermal shock test.

FIG. 4 is a photo showing a cross section of the thermal shock test sample 2 after the thermal shock test. The thermal shock test sample 2 after the thermal shock test includes an SiC layer (the semiconductor member 120), a TiN layer (the second barrier layer 151), a Zn layer (the semiconductor device bonding material 130), a $CuZn_5$ layer, a $Cu_5Zn_8$ layer, and a Cu layer (the second Cu layer 113). At the interface between the Zn layer (the semiconductor device bonding material 130) and the Cu layer (the second Cu layer 113), the Zn layer (the semiconductor device bonding material 130) reacted with the Cu layer (the second Cu layer 113) to form the $CuZn_5$ layer and the $Cu_5Zn_8$ layer. Cracks appeared at parts of $Cu_5Zn_8$ layer but did not propagate inside the Zn layer (the semiconductor device bonding material 130). Outside observation and low-magnification observation of the thermal shock test sample 2 after the thermal shock test could recognize no significant bonding failure (crack, etc.). Thus, favorable bonding was achieved between the semiconductor member 120 and the semiconductor device bonding material 130 and between the substrate 110 and the semiconductor device bonding material 130. At the interface as the bonding interface between the semiconductor member 120 and the Zn layer (the semiconductor device bonding material 130), only the TiN layer (the second barrier layer 151) was formed.

Figure 5:
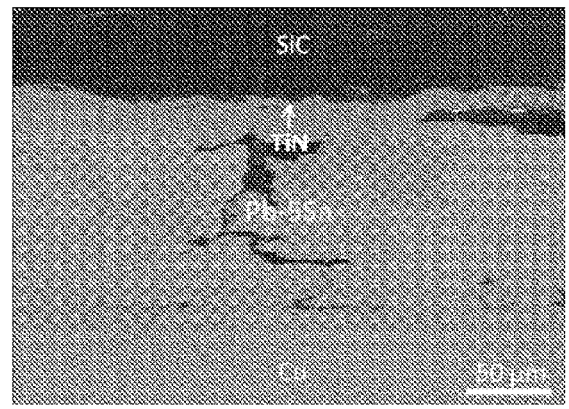
FIG. 5 is a photo showing a cross section of a comparative sample for a thermal shock test after the thermal shock test.

FIG. 5 is a photo showing a cross section of the thermal shock test comparative sample after the thermal shock test. The thermal shock test comparative sample after the thermal shock test includes an SiC layer, a TiN layer, a Pb-5Sn layer (the semiconductor device bonding material), and a Cu layer. Cracks run inside the Pb-5Sb layer (the semiconductor device bonding material)

[Shear Test Sample]

Figure 6A:
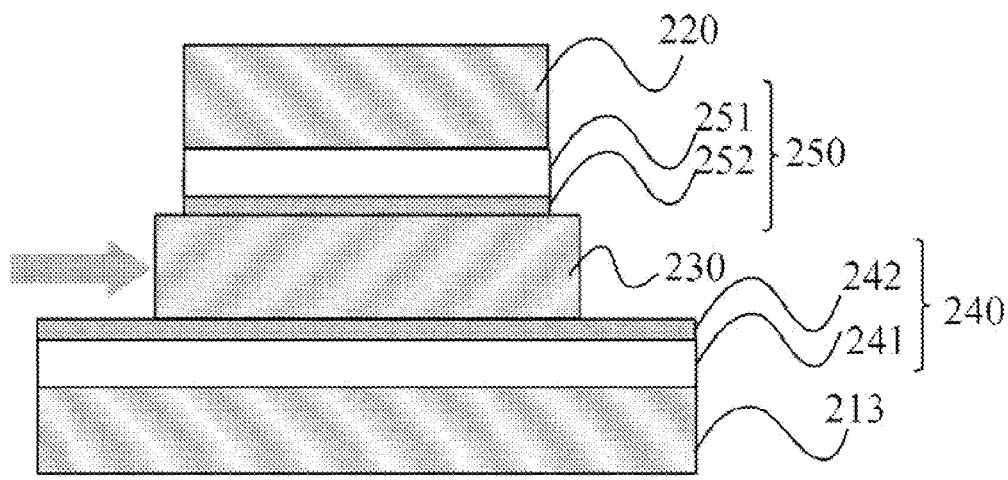
FIG. 6A is a schematic illustration showing the configuration of the shear test sample.

FIG. 6 explains the configuration of a shear test sample and the results of a shear test. FIG. 6A is a schematic illustration showing the configuration of the shear test sample. For the shear test, a shear test sample 1, a shear test sample 2, and a shear test comparative sample were prepared. Each of the shear test sample 1 and the shear test comparative sample includes, in this order from the bottom, a first Cu layer 213 (7 mm long, 11 mm wide, and 0.8 mm thick), a first coating layer 240 (including an Au layer 242 with a thickness of 200 nm and a TiN layer 241 with a thickness of 800 nm), a semiconductor device bonding material layer 230 (4 mm long, 4 mm wide, and 0.2 mm thick), a second coating layer 250 (including an Au layer 252 with a thickness of 200 nm and a TiN layer 251 with a thickness of 800 nm), and a second Cu layer 220 (4 mm long, 4 mm wide, and 0.8 mm thick). The shear test sample 2 includes, of the layers of the shear test sample 1, the layers other than the first coating layer 240. The semiconductor device bonding material of the shear test sample 1 and the shear test sample 2 is pure zinc (a purity of 99.99 wt %). The semiconductor device bonding material of the shear test comparative sample is Pb-5Sn.

Each of the shear test sample 1, the shear test sample 2, and the shear test comparative sample was subjected to a temperature cycle (0-500 times) between −50° C. and 300° C. in the air. In each cycle, the samples were held for 30 minutes. In each of 0th, 250$^{th}$, and 500$^{th}$ temperature cycles, a shock by a head was provided. The test height (position of the head) was 0.1 mm above the upper surface of the first coating layer 240. The test speed (head speed) was 50 μm/s. The location at which shear force was provided (part of the semiconductor device bonding material layer 230) is indicted by an arrow in FIG. 6A.

[Results of Shear Test]

Figure 6B:
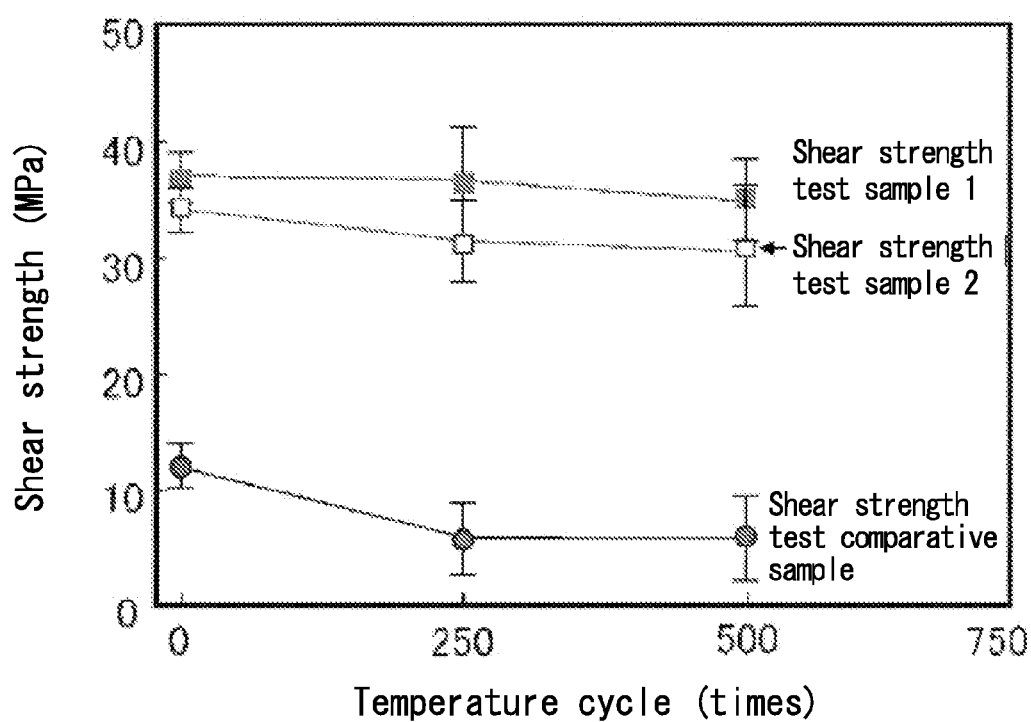
FIG. 6B is a graph representation showing the results of the shear test.

FIG. 6B is a graph representation showing the results of the shear test obtained from the shear test sample 1, the shear test sample 2, and the shear test comparative sample. The axis of ordinate indicates shear strength (MPa). The axis of abscissa indicates the number (times) of the temperature cycles.

Even at the 500$^{th}$ cycle, no change in microstructure of the shear test sample 1 was observed except extremely minute cracks. Thus, highly reliable die attachment bonding could be achieved which can maintain the initial strength. Referring to the shear test sample 2, while cracks appeared in an intrametal compound layer ($Cu_5Zn_8$ layer), no propagation of the cracks occurred in the bonding part (inside the semiconductor device bonding material). Thus, highly reliable die attachment bonding could be achieved which can maintain the initial strength.

The shear test sample 1 exhibited a shear strength of about 36 to 39 MPa, which was about 3.5 times that of the shear test comparative sample.

As described above, in the semiconductor device 100 and the semiconductor device bonding material 130 according to the present invention, the semiconductor device bonding material of which main component is zinc having a melting point of 420° C. is used. This can obtain a next-generation power semiconductor device excellent in thermal fatigue resistance that can withstand temperature cycles up to 300° C.

[Change in Characteristics by Addition of Additive Element]

In order to examine change in characteristics by addition of an additive element, samples 1-5 were prepared. Commercially available zinc to which no additive element is added was prepared as the sample 1. The purity of this zinc was 99.99 wt %. Such zinc is expressed as 4N. Here, zinc to which no additive element is added in the sample 1 may be called pure zinc.

As the samples 2-5, four additives were prepared in which any additive element of Ca, Mn, Ti, and Cr was added to the above zinc so that the respective elements have 0.1 wt %. Thus, Ca, Mn, Ti, and Cr were added to the samples 2-5, respectively.

Specifically, zinc to which the respective impurities were added was melted in an arc furnace under an Ar atmosphere and then was turned over. Melting and turning over were performed three times alternately to prepare zinc alloys containing the respective additive elements as the samples 2-5.

Figure 7:
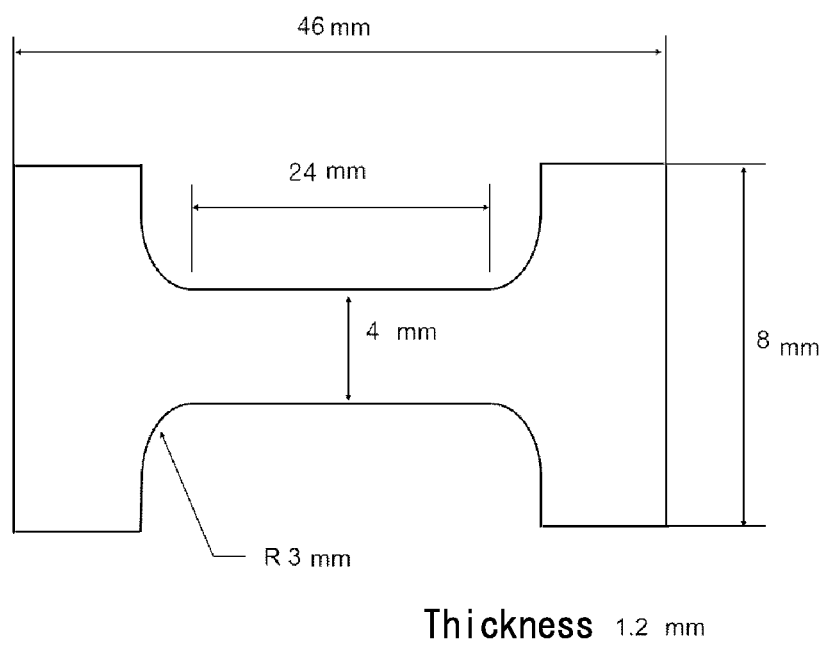
FIG. 7 is a schematic illustration of a test piece for a tensile test.

Next, the samples 1-5 were processed into test pieces for a tensile test. FIG.7 is a schematic illustration of a test piece. Specifically, the samples 1-5 were casted and rolled so as to reduce their thickness from 10-13 mm to 1.3 mm Thereafter, electrical discharge machining was performed. Thus, the sample pieces 1-5 were formed from the samples 1-5, respectively.

Then, the test pieces 1-5 were subjected to polishing so as to have a thickness of 1.2 mm and then subjected to thermal treatment at a temperature of 180° C. for three hours to remove residual stress. Thereafter, each test piece 1-5 was subjected to polishing with an alumina abrasive. In the polishing, the grain diameter of the alumina abrasive was reduced gradually, and the abrasive having a grain diameter of 0.3 μm was used at the final stage.

Ten pieces for each of the test pieces 1-5 were prepared by the above described manner. Then, a tensile test was performed thereon. The extension rate was $7 \times 10^{-4}$ mm/sec. It is noted that any test pieces that were broken at their parts other than the gage length in the tensile test were ignored. Further, of the results of the remaining test pieces, the averages of each six results of the remaining test pieces except the maximum values and the minimum values were calculated.

Figure 8A:
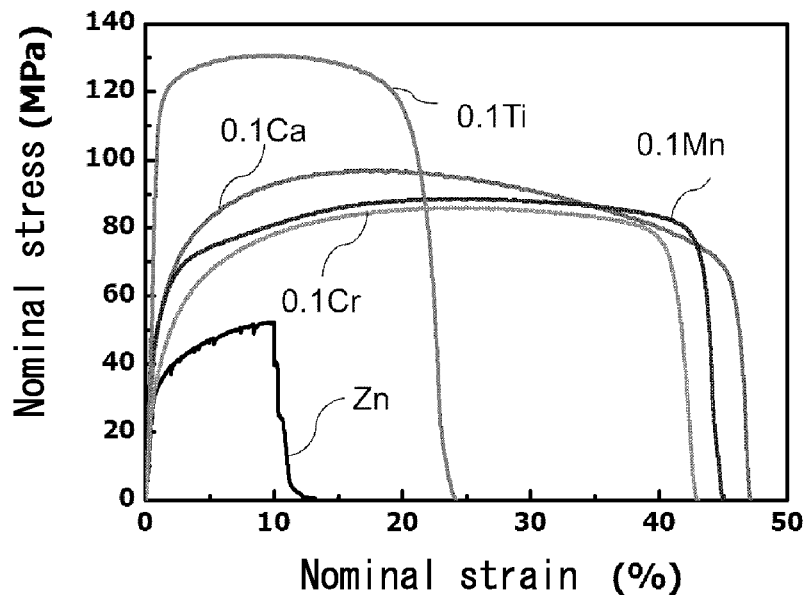
FIGS. 8A and 8B are graph representations showing results of the tensile test.
Figure 8B:
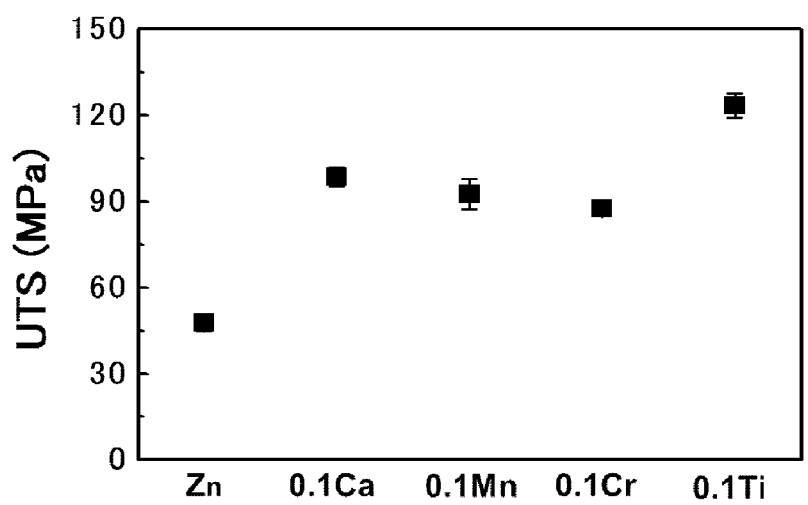

FIG. 8 presents the results of the tensile test. FIG. 8A indicates nominal stress with respect to nominal strain. FIG. 8B shows ultimate tensile stress (UTS) of each of the test pieces 1-5. In FIGS. 8A and 8B, the results of the test pieces 1-5 are indicated by Zn, 0.1Ca, 0.1Mn, 0.1Cr, and 0.1Ti, respectively. Addition of Ca, Mn, Cr, or Ti expanded the elastic ranges and increased the Young's moduli. Especially, addition of Ti significantly increased the Young's module.

Figure 9A:
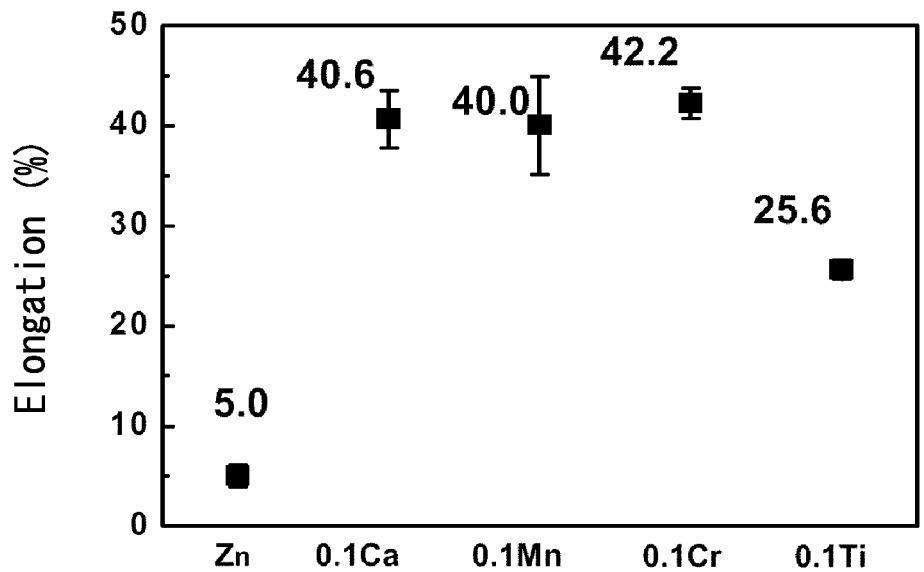
FIGS. 9A and 9B are graph representations showing results of the tensile test.

FIG. 9A shows elongation as the results obtained from the test pieces 1-5. While the test piece 1 had a comparatively low elongation, 5.0%, the test pieces 2-4 to which the respective additive elements were added showed elongations of 20% or higher. Thus, it was found that addition of the additive elements increases the elongation.

Figure 9B:
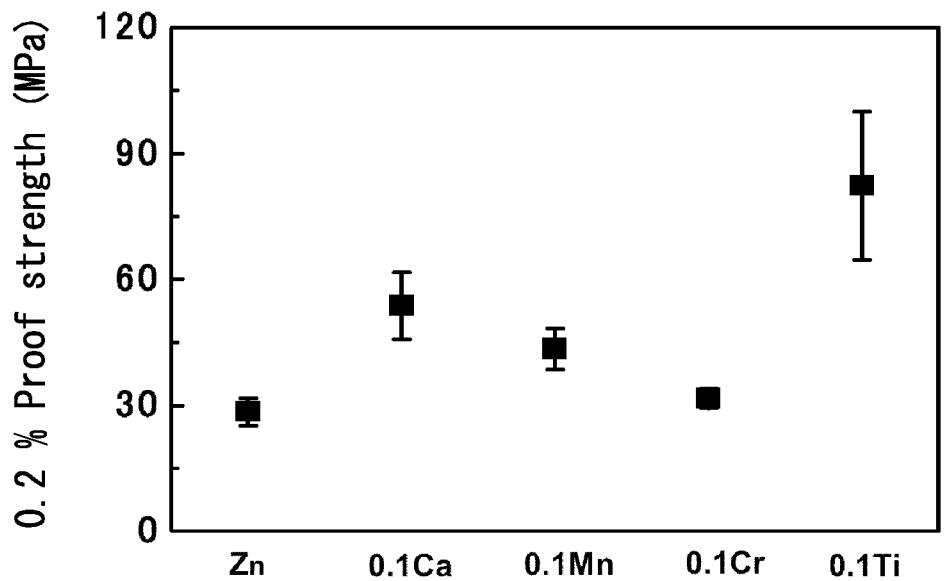
Figure 10A:
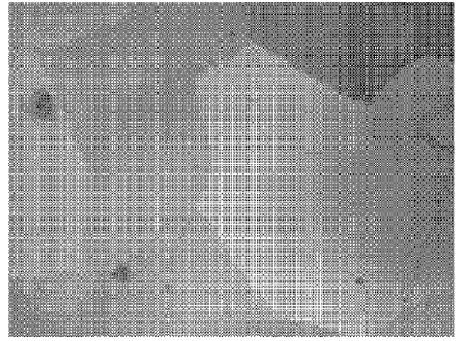
FIGS. 10A to 10E are views showing images of the surfaces of pure zinc and zinc to which respective additive elements are added.
Figure 10B:
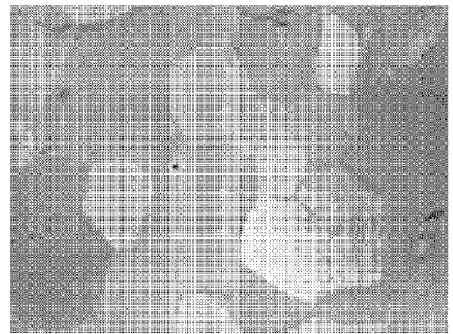
Figure 10C:
Figure 10D:
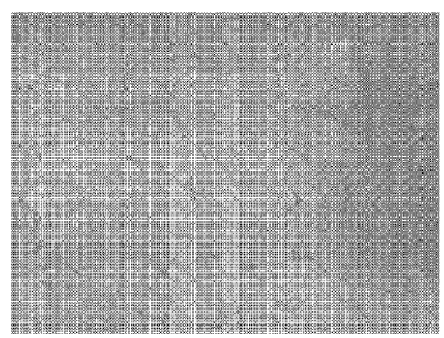
Figure 10E:
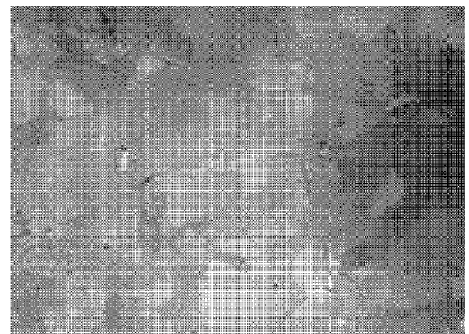

FIG. 9B shows the results of 0.2% proof strength. The samples 2, 3, and 5, to which Ca, Mn, and Ti were added, respectively, had proof strength higher than the sample 1. By contrast, the sample 4 to which Cr was added had almost equivalent proof strength to that of the sample 1. When the semiconductor device bonding material is composed of a material having less proof strength as the sample 4 than that of the samples 2, 3, and 5, the semiconductor device can absorb damage to the semiconductor member when the semiconductor device receives a shock.

FIG. 10 presents enlarged images of the samples 1-5. FIGS. 10A-10E are images of the samples 1-5, respectively. The crystal grains of zinc in the sample 1 were comparatively large. By contrast, addition of the respective additive elements reduced the grain diameters of the zinc crystals. Especially, the samples 4 and 5, to which Cr and Ti were added, respectively, were reduced in grain diameter of the zinc crystals.

Figure 11A:
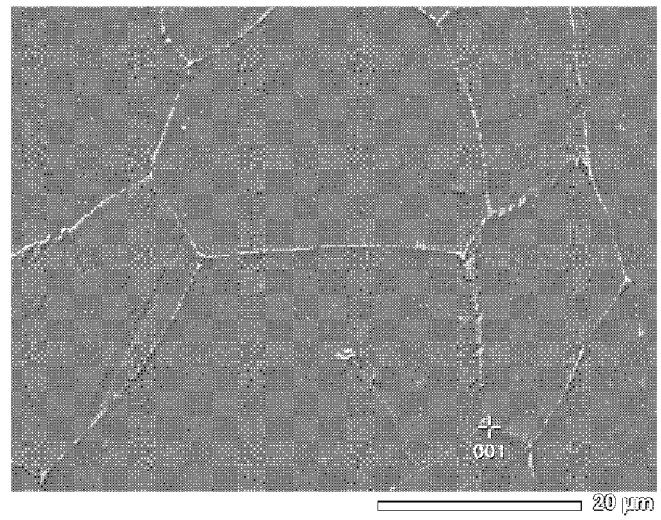
FIGS. 11A and 11B are views showing images of the surfaces of zinc to which an additive element is added and of pure zinc, respectively.
Figure 11B:
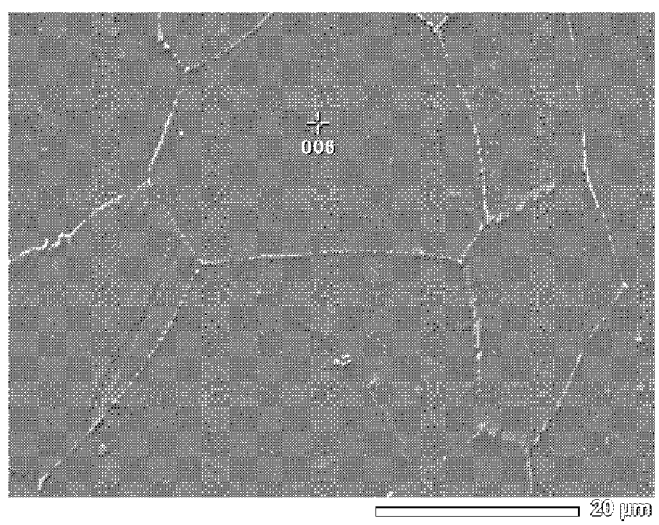

FIGS. 11A and 11B show enlarged images of the respective broken-out sections in the initial structures of the sample 5 to which Ti was added and the sample 1, respectively. Part that seems an intra-metal compound was observed in the sample 5. Energy dispersive X-ray spectroscopy (EDS) performed on the sample 5 found that Zn and Ti had weight percentages (wt %) of 99.43 and 0.57 and atomic percentages (at %) of 99.23 and 0.77, respectively.

Figure 12:
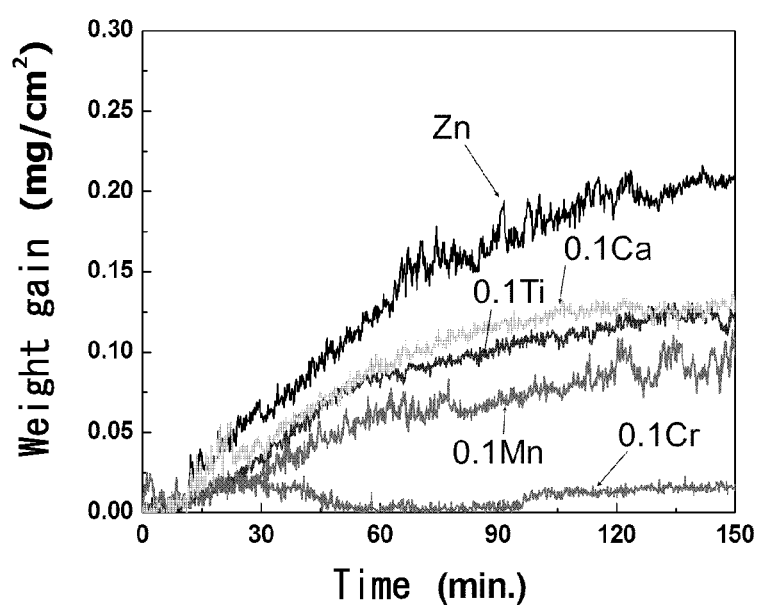
FIG. 12 is a graph representation showing variation in weight gain depending on oxidation time of samples.

In addition, the oxidation speed of each sample 1-5 was measured by thermogravimetry analysis (TGA). Oxidation at a temperature of 400° C. in the air was performed herein. FIG. 12 shows the results of weight gains of the samples 1-5 depending on oxidation time. The weight gain of the sample 1 depending on oxidation time was comparatively large. By contrast, addition of the respective additive elements resulted in comparatively small weight gains depending on the oxidation time in the samples 2-5. Especially, addition of Cr significantly reduced the weight gain. Thus, addition of the respective additive elements (especially addition of Cr) could suppress oxidation of the samples of which main component is zinc.

From the above results, it can be considered that addition of an additive element miniaturized the zinc crystals to increase the strength and elongation.

[Change in Characteristics Depending on Purity of Zinc]

Using some types of zinc having different purities, their characteristics were compared. Here, zinc having a purity of 99.99 wt % (4N) and zinc having a purity of 99.9999 wt % were compared with each other. It is noted that the characteristics of the zinc (4N) having a purity of 99.99 wt % are the same as that having the results described with reference to FIGS. 8 and 9. The zinc having a purity of 99.9999 wt % was prepared as a sample 6 herein. This zinc is expressed as 6N. The sample 6 was rolled to reduce its thickness from 10-13 mm to 1.3 mm and then was subjected to electrical discharge machining to have a shape shown in FIG. 7. Thus, a sample piece 6 was formed from the sample 6.

Next, the test piece 6 was subjected to polishing so as to have a thickness of 1.2 mm and then subjected to thermal treatment at a temperature of 180° C. for three hours to remove residual stress. Thereafter, the test piece 6 was subjected to polishing with an alumina abrasive. In the polishing, the grain diameter of the alumina abrasive was reduced gradually, and the abrasive having a grain diameter of 0.3 μm was used at the final stage. Three test pieces 6 were prepared by the foregoing manner. Then, the tensile test was performed thereon. The extension rate was $7 \times 10^{-4}$ mm/sec.

Figure 13A:
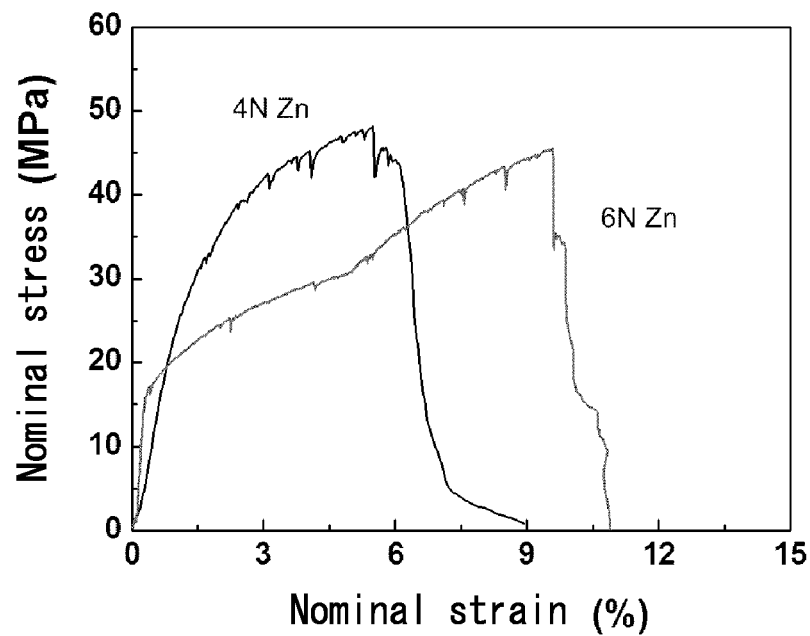
FIGS. 13A and 13B are graph representations showing results of the tensile test.
Figure 13B:
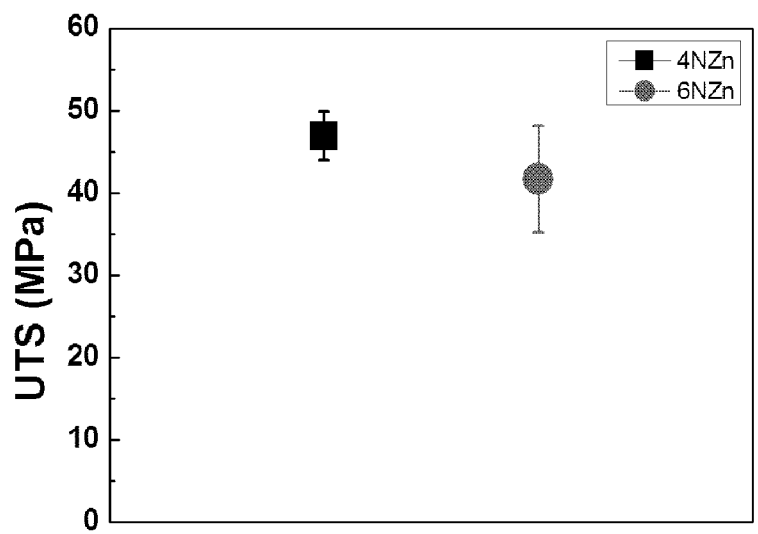

FIG. 13 presents the results of the tensile test. FIG. 13A indicates nominal stress with respect to nominal strain. FIG. 13B shows ultimate tensile stress (UTS) of each of the test pieces 1 and 6. In FIGS. 13A and 13B, the results of the test pieces 1 and 6 are indicated by 4NZn and 6NZn, respectively. As the purity of zinc increased, the elastic range expanded.

Figure 14A:
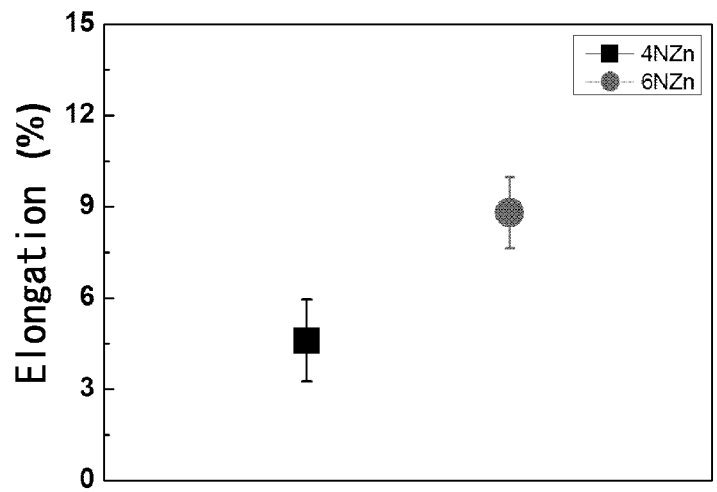
FIGS. 14A and 14B are graph representations showing results of the tensile test.

FIG. 14A shows elongation as the results of each of the test pieces 1 and 6. The elongation of the test piece 1 was comparatively low, 5.0%. By contrast, the elongation of the test piece 6 was over 8%

Thus, as the purity of zinc increased, the elongation increased.

Figure 14B:
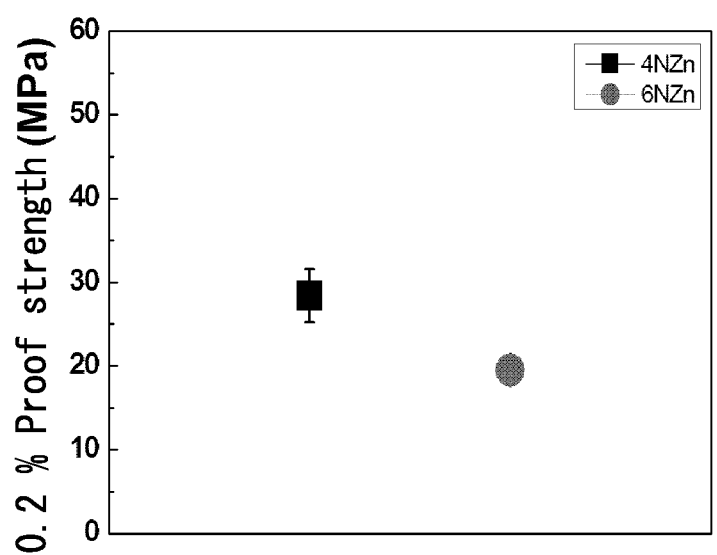

FIG. 14B shows the results of 0.2% proof strength. Increase in purity of zinc accompanied reduction in proof strength. Thus, formation of the semiconductor device bonding material with a material having comparatively low proof strength can preferably absorb damage to the semiconductor member when the semiconductor device receives a shock.

INDUSTRIAL APPLICABILITY

The semiconductor device and the semiconductor device bonding material according to the present invention are applicable to compound semiconductor devices, such as GaN semiconductor devices, SiC semiconductor devices, etc. developed as next-generation power semiconductors.

REFERENCE SIGNS LIST 100 semiconductor device
110 substrate
111 insulating layer
112 first Cu layer
113 second Cu layer
120 semiconductor member
130 semiconductor device bonding material
140 first coating layer
141 first protective layer
142 first barrier layer
150 second coating layer
151 second protective layer
152 second barrier layer

The invention claimed is:

1. A semiconductor device, comprising: a substrate; and a semiconductor member stacked on the substrate, wherein the semiconductor member and the substrate are bonded together by means of a semiconductor device bonding material of which main component is zinc, a coating layer to prevent diffusion of the semiconductor device bonding material is provided on at least one of the surface of the substrate and the surface of the semiconductor member, and the coating layer is configured such that a barrier layer composed of nitride, carbide, or carbonitride and a protective layer composed of a noble metal are stacked.

2. The semiconductor device of claim 1, wherein the nitride, the carbide, or the carbonitride composing the barrier layer is selected so as to have free energy smaller than that of a material composing an insulating layer provided in the substrate.

3. The semiconductor device of claim 1, wherein a material composing the barrier layer is TiN, a material composing the protective layer is Au, Ag, Cu, Ni, or Pd, and a material composing an insulating layer included in the substrate is $Si_3N_4$, $Al_2O_3$, or AlN.

4. The semiconductor device of claim 1, wherein the zinc in the semiconductor device bonding material has a purity of 90 wt % or higher.

5. The semiconductor device of claim 4, wherein the zinc in the semiconductor device bonding material has a purity of 99.9999 wt % or higher.

6. The semiconductor device of claim 1, wherein the barrier layer has a thickness in the range from 100 nm to 2000 nm, and the protective layer has a thickness in the range from 20 nm to 500 nm.

7. The semiconductor device of claim 1, wherein the semiconductor device bonding material contains an additive element.

8. The semiconductor device of claim 7, wherein the additive element includes at least one element selected from the group consisting of Ca, Mn, Ti, Cr, Ni, V, and Nb.

* * * * *